(12) United States Patent
Suzuki (10) Patent No.: US 6,295,119 B1
(45) Date of Patent: Sep. 25, 2001

(54) SCANNING TYPE EXPOSURE APPARATUS WITH MULTIPLE FIELD DIAPHRAGMS FOR PROVIDING CONSISTENT EXPOSURE

(75) Inventor: Kazuaki Suzuki, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/231,634

(22) Filed: Jan. 15, 1999

Related U.S. Application Data (63) Continuation of application No. 08/654,747, filed on May 29, 1996.

(30) Foreign Application Priority Data

Jun. 2, 1995 (JP) .................................................. 7-160064

(51) Int. Cl.$^7$ ........................... G03B 27/42; G03B 27/58; G03B 27/32
(52) U.S. Cl. .................................. 355/53; 355/74; 355/77
(58) Field of Search ................................. 355/53, 68, 69, 355/71, 55, 77; 250/205, 201.1

(56) References Cited

U.S. PATENT DOCUMENTS

| 4,702,592 | 10/1987 | Geiger et al. . |
|---|---|---|
| 5,473,410 | 12/1995 | Nishi . |
| 5,477,304 | 12/1995 | Nishi . |
| 5,486,896 | 1/1996 | Hazama et al. . |
| 5,591,958 | * 1/1997 | Nishi et al. ............................. 355/71 |
| 5,617,182 | * 4/1997 | Wakamoto et al. ................... 355/53 |
| 5,646,715 | 7/1997 | Wangler . |
| 5,659,383 | 8/1997 | Ozawa . |
| 5,661,546 | 8/1997 | Taniguchi . |
| 5,661,548 | 8/1997 | Imai . |
| 5,663,784 | 9/1997 | Tanimoto . |
| 5,721,608 | * 2/1998 | Taniguchi .............................. 355/53 |
| 5,777,724 | 7/1998 | Suzuki . |

FOREIGN PATENT DOCUMENTS

| B-46-34057 | 10/1971 | (JP) . |
|---|---|---|
| A-6-132195 | 5/1994 | (JP) . |
| A-7-94387 | 4/1995 | (JP) . |

OTHER PUBLICATIONS

SPIE vol. 922, Optical/Laser Microlithography (1988), "Seamless Stitching for Large Area Integrated Circuit Manufacturing", James P. Rominger, pp. 188–193.

* cited by examiner

Primary Examiner—Russell Adams
Assistant Examiner—Peter B. Kim
(74) Attorney, Agent, or Firm—Oliff & Berridge PLC (57) ABSTRACT

A scanning exposure apparatus of the scan-and-stitch type for stitching and forming a plurality of pattern images while partially superimposing them on a photosensitive substrate along a direction perpendicular to a scanning direction. The apparatus includes a fixed field diaphragm for setting a width of an illumination area in the scanning direction on the mask, and a variable field diaphragm comprising third and fourth shielding plates for restricting the width of the illumination area in the scanning direction, and first and second shielding plates which are rotationally movable in a plane perpendicular to an optical axis of an illumination optical system for setting a width of the illumination area in the direction perpendicular to the scanning direction. Scanning exposure is performed while each of the first and second shielding plates maintains an identical rotational angle over a connecting area of an image-plane stitching section. Thus the same amount of exposure light is obtained on the connecting area and the other areas.

38 Claims, 6 Drawing Sheets

SCANNING TYPE EXPOSURE APPARATUS WITH MULTIPLE FIELD DIAPHRAGMS FOR PROVIDING CONSISTENT EXPOSURE

This is a Continuation of application Ser. No. 08/654,747 filed May 29, 1996. The entire disclosure of the prior application(s) is hereby incorporated by reference herein in its entirety.

FIELD OF THE INVENTION

The present invention relates to an apparatus for scanning and exposing a photosensitive substrate with a pattern image on a mask by synchronously scanning the mask and the photosensitive substrate with respect to an illumination area on the mask. In particular, the present invention relates to a scanning exposure apparatus of the scan-and-stitch type which stitches and forms a pattern on a photosensitive substrate by performing scanning exposure two or more times while partially superimposing a plurality of pattern images along a direction perpendicular to a scanning direction.

BACKGROUND OF THE INVENTION

A projection exposure apparatus, in which a photosensitive substrate such as a wafer and a glass plate with a photoresist applied thereon is exposed with a pattern on a photomask or a reticle (hereinafter generally referred to as "reticle") through a projection optical system, has been hitherto used to produce, for example, semiconductor devices, liquid crystal display devices, and thin film magnetic heads by using the photolithography technique. Recently, the trend of technology is such that one chip pattern included, for example, in a semiconductor device becomes large. Accordingly, the projection exposure apparatus is required to handle a large superficial content of an objective transfer pattern so that the photosensitive substrate is exposed with a pattern on the reticle having a larger superficial content.

As the pattern of the semiconductor device or the like becomes finer and finer, the projection optical system is required to have an improved resolution. In order to improve the resolution of a projection optical system, the exposure field of the projection optical system may be increased, however, such an approach is difficult because of problems concerning design and production. Especially, when a catadioptric system is used as the projection optical system, an exposure field having no aberration is formed as a circular-arc shaped area in some cases.

In order to respond to the use of the large superficial content of the objective transfer pattern and the constraint of the exposure field of the projection optical system as described above, for example, a projection exposure apparatus of the so-called slit scan exposure system has been developed, in which a photosensitive substrate is exposed with a pattern having a superficial content wider than that of a slit-shaped illumination area on a reticle by synchronously scanning the reticle and the photosensitive substrate with respect to the illumination area having a circular-arc shape or a hexagonal shape (such an illumination area is hereinafter generally referred to as "slit-shaped illumination area").

The term "illumination area" herein means an area formed on a reticle illuminated with illumination light from an illumination optical system. The term "exposure area" herein means an area formed on a photosensitive substrate illuminated with light for exposure. The exposure area, which is formed as an area on the photosensitive substrate, is conjugate with respect to the illumination area through a projection optical system.

A projection exposure apparatus of the scan-and-stitch type has been proposed, in which the slit scan exposure system is adopted, however, a series of patterns are stitched and formed on a photosensitive substrate while partially superimposing a plurality of pattern images along a direction (referred to herein as "non-scanning direction", if necessary) perpendicular to a scanning direction. When the projection exposure apparatus of this type is used, a reticle is exchanged or the reticle is moved on a reticle stage in the direction perpendicular to the scanning direction after one time of scanning exposure, while a photosensitive substrate is moved in the direction perpendicular to the scanning exposure direction so that scanning exposure is performed two or more times. In general, the projection exposure apparatus is bound by definition of conditions for proper amount of exposure light and uniformity of illuminance with respect to a photosensitive material on a photosensitive substrate. Accordingly, the projection exposure apparatus of the slit scan exposure system also undergoes exposure light amount control in order that the exposure light amount for a photosensitive substrate is coincident with a proper exposure light amount within a predetermined allowable range, and the uniformity of illuminance for a wafer is maintained at a predetermined level. The exposure apparatus of the scan-and-stitch type described above is also required to undergo exposure light amount control in order that the uniformity of illuminance for a wafer is maintained at a predetermined level in the same manner as described above.

When the exposure apparatus of the scan-and-stitch type is used, a series of patterns are stitched and formed on a photosensitive substrate. Accordingly, there is a possibility that an area having a large cumulative exposure light amount and an area having a small cumulative exposure light amount may be locally generated at a stitching section on the photosensitive substrate. Such an inconvenience is caused because of the following reason. Namely, assuming that the light intensity rises from zero to 100% as if it follows a step function from the outside to the inside of a slit-shaped illumination area at both ends of the illumination area in the non-scanning direction (direction perpendicular to the scanning direction), the cumulative exposure light amount at the stitching section on the photosensitive substrate possibly becomes 2-fold or zero as compared with other areas if the positioning accuracy for the photosensitive substrate is low.

In order to countermove this inconvenience, Japanese Pat. Publication No. 46-34057 discloses a technique for stitching image planes (chip patterns) in the non-scanning direction by using a continuous luminescence light source such as a mercury lamp, in which the light intensity in the non-scanning direction of an exposure area on a photosensitive substrate is lowered at both ends thereof so that the light intensity distribution in the non-scanning direction is allowed to have a shape of an isosceles trapezoid. The technique for deforming the shape of illuminance distribution of the exposure area, which is described in the aforementioned official gazette, is also disclosed in Japanese Pat. Publication No. 53-25790 and SPIE, Vol. 774, p. 108 (1987) written by D. A. Markle.

Regardless of the exposure system such as the static exposure system and the scanning exposure system, other techniques for changing illuminance distribution of an exposure area include, for example, a method in which an illumination area is formed with defocusing by moving a field diaphragm along a direction of an optical axis as reported by J. P. Rominger in SPIE, Vol. 922, p. 188 (1988), and a method in which illuminance distribution in a direction perpendicular to a scanning direction is allowed to have a shape of an isosceles trapezoid by using an ND filter having linearly changing transmittance distribution as disclosed in U.S. Pat. No. 5,477,304.

In recent years, a plurality of circuit patterns are simultaneously provided on a reticle in order to improve the throughput by shortening the time required to exchange the reticle. A movable field diaphragm is used to select a desired transfer pattern area from such a plurality of circuit pattern areas on the reticle. The movable field diaphragm is usually arranged in the vicinity of a reticle pattern or at a position conjugate to the reticle pattern in an illumination system in order to sufficiently decrease the width of a shielding area around a pattern area intended for exposure. The superficial content of an opening formed by the movable field diaphragm can be changed in accordance with the size of the pattern area intended for exposure. For example, Japanese Patent Laid-open No. 7-94387 (U.S. patent application Ser. No. 08/255,997 filed on Jun. 8, 1994) discloses a movable field diaphragm having two movable blade (shielding plates) arranged in a scanning direction of a scanning type exposure apparatus. In this technique, an edge of each of the blades for defining an opening of the field diaphragm is moved during scanning exposure in synchronization with scanning movement of a reticle so as to cover a reticle pattern portion to be shielded other than portions defined as shielding bands on the reticle.

In the technique for changing the illuminance distribution of an exposure area in the non-scanning direction described above, patterns are stitched on a photosensitive substrate in the direction perpendicular to the scanning direction. In this procedure, the right and left sides of the light intensity distribution of the exposure area are symmetrical in the direction perpendicular to the scanning direction, and a stitching section receives the same amount of exposure light as that received at its opposite side. For example, the illuminance distribution for the non-scanning direction obtained by integrating the illuminance over the scanning direction has a shape of an isosceles trapezoid in the conventional technique described above. In such a conventional technique, the illuminance of exposure light also gradually decreases toward both ends in the non-scanning direction at the area located on the side opposite to the stitching section. Therefore, an exposed portion on the side, at which no pattern image is superimposed, undergoes exposure only once at a low light intensity, resulting in occurrence of under exposure as compared with a central portion. For this reason, a problem arises in that uniform exposure is not obtained over the entire photosensitive substrate. In order to avoid such local under exposure, it has been necessary to provide a shielding plate having a width wider than conventional one on the side at which no stitching section is formed.

SUMMARY OF THE INVENTION

An object of the present invention is to provide a scanning exposure apparatus for stitching and forming a predetermined pattern on a photosensitive substrate by partially superimposing a plurality of pattern images in a direction perpendicular to a scanning direction, in which a superimposing section for the plurality of pattern images has an exposure light amount substantially the same as that of the other exposure areas.

Another object of the present invention is to provide a projection exposure apparatus for performing projection exposure of the scan-and-stitch type, in which the light intensity can be independently lowered at any one of ends of an illumination area in a non-scanning direction.

According to a first aspect of the present invention, there is provide a scanning type exposure apparatus comprising:
an illumination optical system for illuminating a mask;
a scanning system for synchronously scanning the mask and a photosensitive substrate with respect to an illumination area on the mask;
a first field diaphragm for setting a width of the illumination area in a scanning direction; and
a second field diaphragm for varying a shape of at least one end of the illumination area in a direction perpendicular to the scanning direction.

The scanning exposure apparatus is preferably provided as a scanning exposure apparatus of the scan-and-stitch type for stitching and forming a plurality of pattern images while partially superimposing them on the photosensitive substrate along the direction perpendicular to the scanning direction. The second field diaphragm preferably comprises a shielding plate which is movable in a plane perpendicular to an optical axis of the illumination optical system for restricting the shape of the at least one end of the illumination area in the direction perpendicular to the scanning direction so as to provide intersection with the scanning direction. The second field diaphragm preferably comprises first and second shielding plates which are arranged in a plane perpendicular to the optical axis of the illumination optical system and at least one of which is rotatable in the plane described above for restricting the shapes of both ends of the illumination area in the direction perpendicular to the scanning direction respectively.

When the scanning exposure apparatus of the present invention is used for an exposure operation in accordance with the scan-and-stitch system, at least one of the first and second shielding plates can be independently rotated in the plane perpendicular to the optical axis so that the light intensity distribution gradually lowers on a side of the illumination area at which the pattern image is superimposed in the direction perpendicular to the scanning direction. More specifically, the shielding plate (or its edge) located on the side at which the pattern image is superimposed is inclined with respect to the scanning direction so that a part of light for radiating the end of the illumination area in the non-scanning direction is shielded, while the shielding plate (or its edge) located on another side at which the pattern image is not superimposed is arranged in parallel to the scanning direction. In accordance with such an operation, the under exposure is readily avoided on the side at which the pattern image is not superimposed in the exposure area of the photosensitive substrate, and the exposure light amount of the superimposing section for the plurality of patterns on the photosensitive substrate can be made to be substantially the same as those of the other areas.

According to a second aspect of the present invention, there is provided a scanning type exposure apparatus comprising:
an illumination optical system for illuminating a mask;
a scanning system for synchronously scanning the mask and a photosensitive substrate with respect to an illumination area on the mask;
a first field diaphragm for setting a width of the illumination area in a scanning direction; and
a second diaphragm comprising first and second shielding plates for restricting the shapes of both ends of the illumination area in a direction perpendicular to the scanning direction respectively, wherein at least one of the first and second shielding plates is movable along an optical axis of the illumination optical system with respect to a pattern plane on the mask or a plane conjugate to the pattern plane.

The scanning exposure apparatus according to the second aspect of the present invention is preferably provided as a scanning exposure apparatus of the scan-and-stitch type for stitching and forming a plurality of pattern images while partially superimposing them on the photosensitive substrate along the direction perpendicular to the scanning direction.

When the scanning type exposure apparatus of the present invention is used for an exposure operation in accordance with the scan-and-stitch system, the first and second shielding plates can be independently moved along the optical axis so that the light intensity distribution gradually lowers on a side of the illumination area at which the pattern image is superimposed in the direction perpendicular to the scanning direction. Specifically, only the shielding plate located on the side at which the pattern image is superimposed is moved along the optical axis so that the shielding plate is separated from the reticle pattern or its conjugate plane. Thus the image of the shielding plate is defocused on the reticle pattern. In accordance with such operation, the exposure light amount is lowered on the side at which the pattern image is superimposed in the exposure area of the photosensitive substrate (under exposure). On the other hand, the under exposure is not performed on the side at which the pattern image is not superimposed. Accordingly, the exposure light amount of the superimposing section for the plurality of patterns on the photosensitive substrate can be made to be substantially the same as those on the other areas.

DETAILED DESCRIPTION OF PREFERRED EMBODIMENTS

Figure 1:
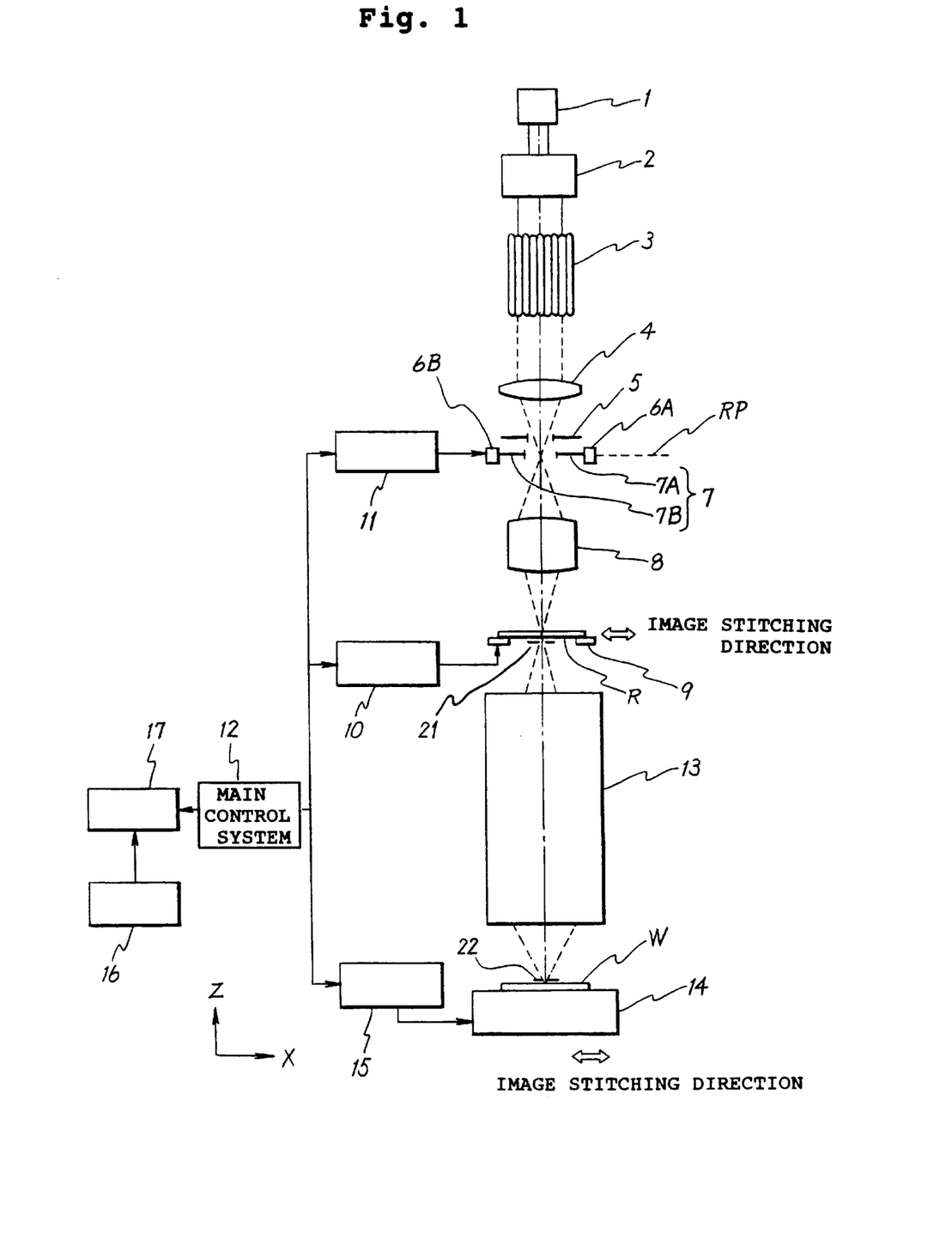
FIG. 1 shows a schematic illustration of an embodiment of a scanning type exposure apparatus of the present invention.

An embodiment of a projection exposure apparatus of the scan-and-stitch type according to the present invention will be explained below with reference to FIGS. 1 to 6. FIG. 1 shows a schematic illustration of the projection exposure apparatus of this embodiment. This projection exposure apparatus principally comprises a pulse light source 1 for emitting illumination light, an illumination optical system for providing uniform illuminance of the illumination light and defining an illumination area on a reticle R, a reticle stage 9 for scanning the reticle R, a projection optical system 13 for projecting a reticle pattern onto a wafer W, and a wafer stage 14 for two-dimensionally moving the wafer W.

Those usable as the pulse light source 1 include, for example, excimer laser light sources such as an ArF excimer laser and a KrF excimer laser, metal vapor laser sources, and high harmonic wave generators such as a YAG laser. Alternatively, it is also allowable to use a continuous light beam represented by bright-lines (for example, i-ray) from a mercury lamp instead of the pulse light source.

The illumination optical system comprises a beam-shaping optical system 2 comprising a cylindrical lens and a beam expander, a fly's eye lens 3, a condenser lens 4, a fixed field diaphragm 5, a movable blind 7, and a relay lens 8. A light beam emitted from the pulse light source 1 undergoes expansion of its beam diameter by the beam-shaping optical system 2, and it comes into the fly's eye lens 3. A large number of secondary light sources are formed on an emitting plane of the fly's eye lens 3. Pulse illumination light outgoing from the secondary light sources is collected by the condenser lens 4, and it arrives at the movable blind 7 through the fixed field diaphragm 5.

Figure 2:
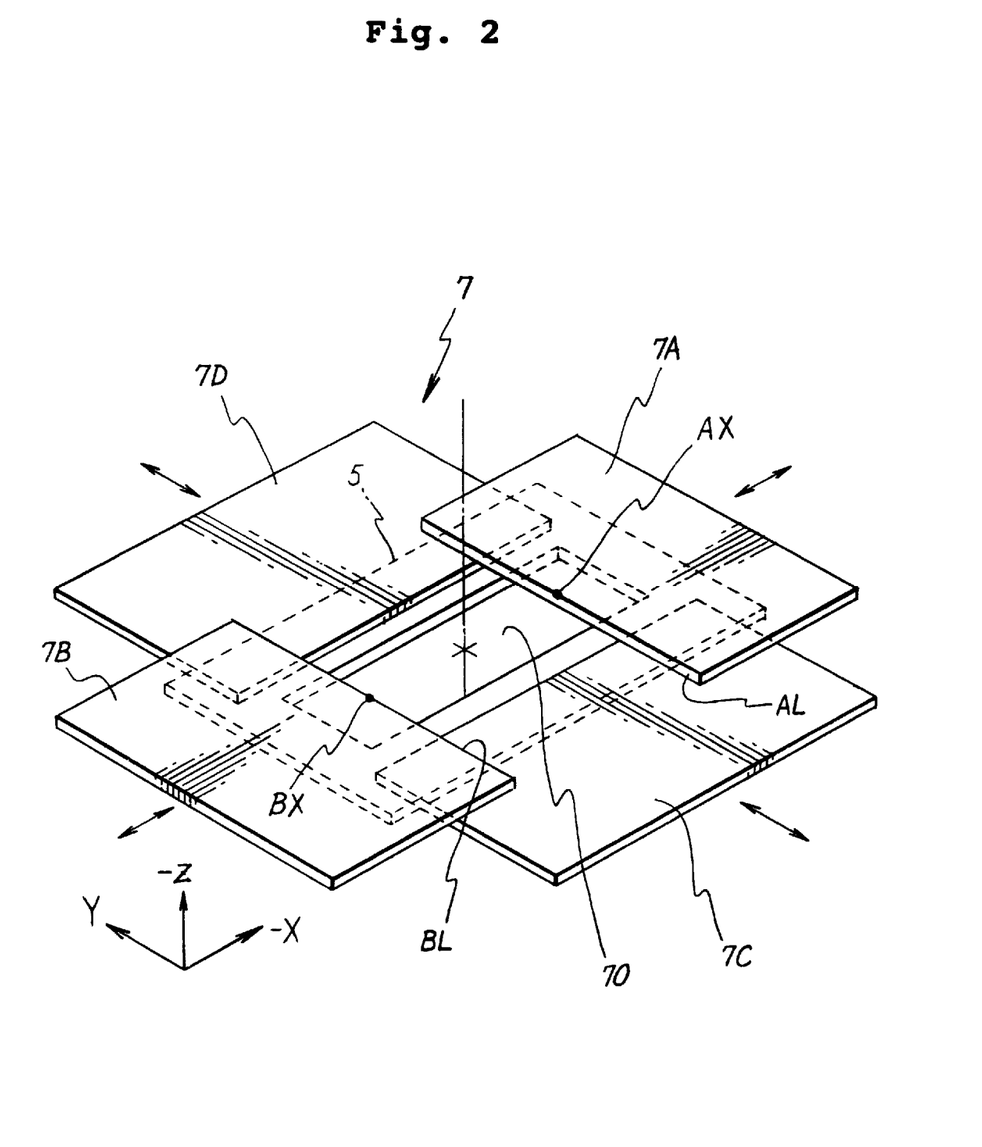
FIG. 2 shows an arrangement and a schematic illustration of a fixed field diaphragm and shielding plates for restricting widths of an illumination area in scanning and non-scanning directions, used in the projection exposure apparatus of the embodiment of the present invention.

FIG. 2 shows a schematic illustration and an arrangement of the fixed field diaphragm 5 and the movable blind 7 in the exposure apparatus illustrated in FIG. 1. FIG. 2 is depicted as a perspective view as viewed from an obliquely downward position in order to clearly illustrate a structure of the movable blind 7. Accordingly, the illumination light beam passes from a downward position to an upward position in FIG. 2. The fixed field diaphragm 5 is a rectangular plate with its longitudinal direction perpendicular to the scanning direction, which has a rectangular slit-shaped opening 70 formed in its inside. After the light beam from the relay lens 4 has passed through the opening 70 of the field diaphragm 5, it becomes a light beam having a rectangular slit-shaped cross section. The movable blind 7, which is composed of four rectangular shielding plates for restricting the illumination area on the reticle R, is arranged under (in FIG. 2, over) the fixed field diaphragm 5. In this embodiment, the movable blind 7 functions as a movable field diaphragm. Shielding plates 7C, 7D for restricting the width of the illumination area on the reticle R in the scanning direction are located in a plane conjugate to a pattern plane on the reticle R, which are arranged to opposed to one another in the scanning direction with the opening 70 of the fixed field diaphragm 5 interposed therebetween. The shielding plates 7C, 7D are independently movable in the scanning direction (Y or −Y direction in FIG. 2) respectively in accordance with the action of an unillustrated driving unit, which are capable of restricting the width of the opening 70 of the fixed field diaphragm 5 in the scanning direction to provide any dimension.

On the other hand, a pair of shielding plates 7A, 7B for restricting the width of the illumination area on the reticle R in the direction perpendicular to the scanning direction are located under (in FIG. 2, over) the shielding plates 7C, 7D and disposed in the vicinity thereof. The shielding plates 7A, 7B are movable in the non-scanning direction (X or −X direction in FIG. 2) in accordance with the action of driving units 6A, 6B (see FIG. 1). In addition, the shielding plates 7A, 7B are rotatable in a plane perpendicular to an optical axis respectively about centers of a middle point AX of an edge AL and a middle point BX of an edge BL in accordance with the action of a combined mechanism comprising a translational driving unit and a rotational driving unit based on a motor and gears, the longitudinal edges AL, BL defining an opening of the movable blind comprising the shielding plates. Alternatively, the shielding plates 7A, 7B may be designed so that they are independently movable in substantially parallel to the optical axis respectively in accordance with the action of the driving units 6A, 6B as described below. Owing to the design of the movable blind 7 as described above, the slit-shaped illumination area 21 on the reticle R, which is firstly set by the fixed field diaphragm 5, is further restricted by the movable blind 7 so that a desired exposure area is formed on the photosensitive substrate. The operation of the driving units for the movable blind 7 is controlled by a movable blind control unit 11. The operation of the movable blind 7 will be described in detail below.

The light beam restricted by the movable blind 7 comes into the relay lens system 8. The relay lens system 8 is a lens system provided for maintaining a conjugate relation between the pattern formation plane on the reticle R and the shielding plates 7C, 7D for restricting the width of the illumination area on the reticle in the scanning direction included in the movable blind 7. The relay lens system 8 is an optical system which is telecentric on both sides.

Figure 6:
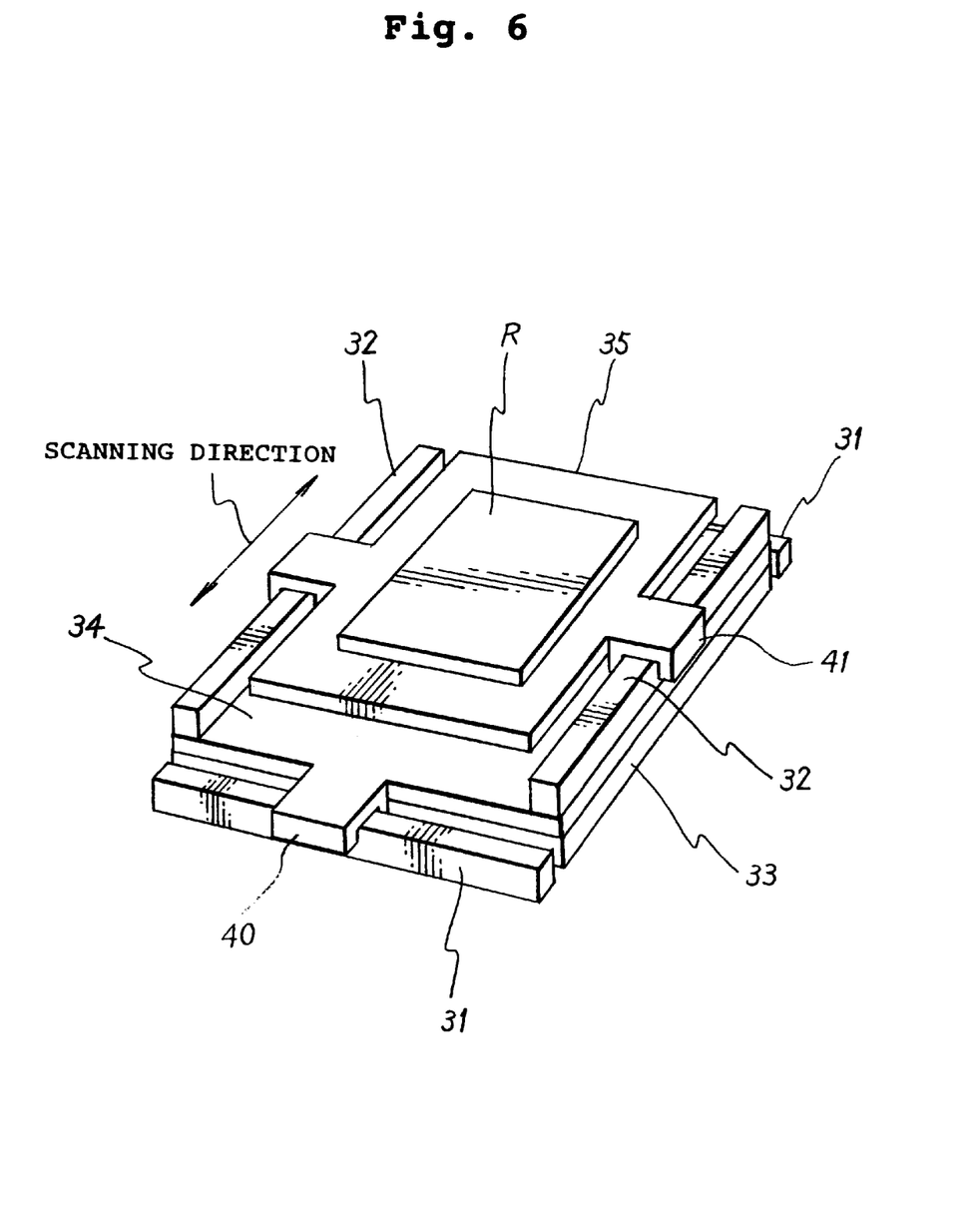
FIG. 6 shows a schematic perspective view illustrating a two-dimensional air stage used to two-dimensionally move the reticle R in the embodiments.

The reticle stage 9, on which the reticle R is placed, is driven by a reticle stage driving unit 10 so that the reticle R is moved in the scanning direction. It is defined herein, in a two-dimensional plane perpendicular to the optical axis of the projection optical system 13, that the scanning direction of the reticle R with respect to the slit-shaped illumination area 21 is "Y direction" (or "−Y direction") (direction perpendicular to the plane of paper in FIG. 1), and the direction perpendicular to the scanning direction is "X direction" (or "−X direction"). It is also defined herein that the direction parallel to the optical axis of the projection optical system 13 is "Z direction". The reticle stage 9 is not only movable in the scanning direction, but also movable in the direction perpendicular to the scanning direction (image stitching direction) in order to execute image stitching for the reticle pattern. The movement may be performed by using a two-dimensional air stage as illustrated in FIG. 6. The air stage comprises an X stage 34 movable in the X direction for placing the reticle R thereon, and a Y stage 35 movable in the Y direction arranged on the X stage 34. The X stage 34 is capable of moving the reticle R in the X direction in such a manner that X direction air guides 40 attached on both sides of the X stage in the scanning direction move in a non-contact manner over X direction linear motors 31 coupled to a stage base plate 33. The Y stage 35 is capable of moving the reticle R in the Y direction in such a manner that Y direction air guides 41 attached on both sides of the Y stage in the non-scanning direction move in a non-contact manner over Y direction linear motors 32 coupled to the X stage 34. The image stitching operation will be described below together with the operation of the movable blind 7.

The wafer W is exposed by projection through the projection optical system 13 with an image of a circuit pattern located in the slit-shaped illumination area 21 on the reticle R. The wafer W is placed on the wafer stage 14. A slit-shaped exposure area 22 conjugate to the slit-shaped illumination area 21 is formed on the wafer W. The position of the wafer W is determined by the wafer stage 14 in a plane perpendicular to the optical axis of the projection optical system 13. The wafer stage 14 comprises an XY stage and a Z stage. The XY stage scans the wafer W in the ±Y direction, and it makes stepping in the X or −X direction for image stitching. The Z stage determines the position of the wafer W in the Z direction.

A main control unit 12 controls the positioning operation and the scanning operation of the wafer stage 14 through a wafer stage driving unit 15. The operations of the reticle stage driving unit 10 and the movable blind control unit 11 are managed by the main control unit 12 for controlling the operation of the entire apparatus.

The apparatus is arranged as described above, which is used to expose each of shot areas on the wafer W with the pattern image on the reticle R through the projection optical system 13 in accordance with the scanning system. In this procedure, the reticle R is scanned through the reticle stage 9 in the Y direction (or −Y direction) with respect to the slit-shaped illumination area 21 set by the field diaphragm 5. The wafer W is scanned through the wafer stage 14 in the −Y direction (or Y direction) with respect to the slit-shaped exposure area 22 conjugate to the slit-shaped illumination area 21 in synchronization with the scanning for the reticle R. Namely, the −Y direction (or Y direction) is the scanning direction for the wafer W. The reticle R and the wafer W are synchronously scanned as described above. Thus the circuit pattern image on the reticle R is successively transferred onto each of the shot areas on the wafer W.

When a plurality of circuit pattern areas are simultaneously provided on the reticle as described above, the movable blind is used to select a desired transfer pattern area from the plurality of circuit pattern areas on the reticle. The movable blind 7 is also used for such a purpose in the projection exposure apparatus of this embodiment. Accordingly, the projection exposure apparatus of this embodiment is provided with an input unit 16 for inputting information on the circuit pattern areas on the reticle R, and a memory unit 17 for storing the circuit pattern information sent from the input unit 16. The main control unit 12 drives the shielding plates 7C, 7D through the movable blind control unit 11 and the driving unit for the shielding plates 7C, 7D included in the movable blind 7, on the basis of the circuit pattern information stored in the memory unit 17.

Figure 3A:
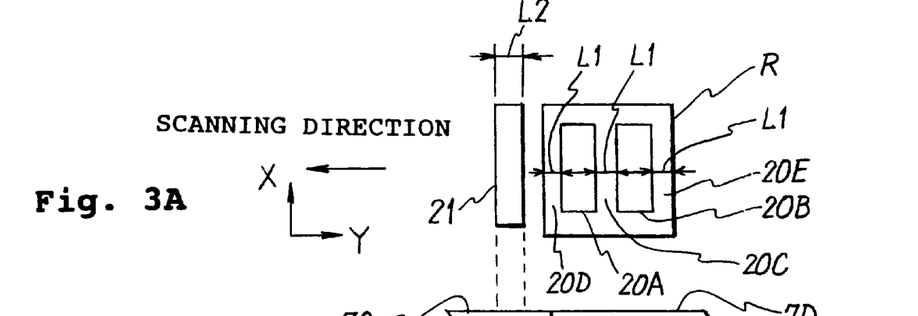
FIGS. 3A to 3F show an operation of the shielding plates, directed to a reticle on which two circuit patterns are formed and its illumination area, for restricting the width of the illumination area in the scanning direction during scanning exposure.
Figures 3B, 3C:
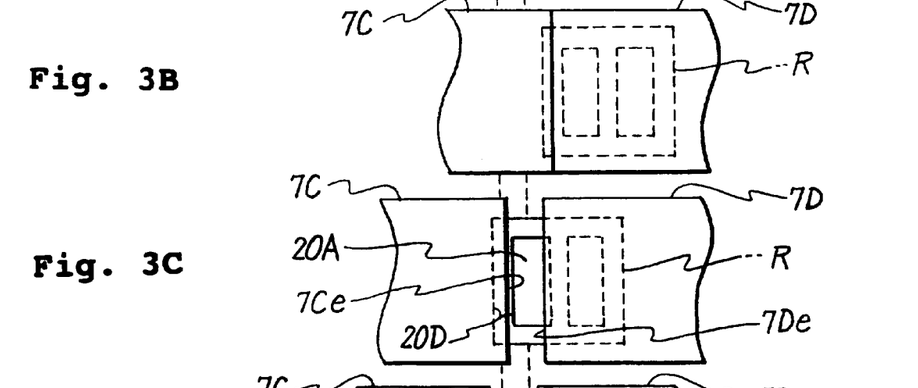
Figure 3D:
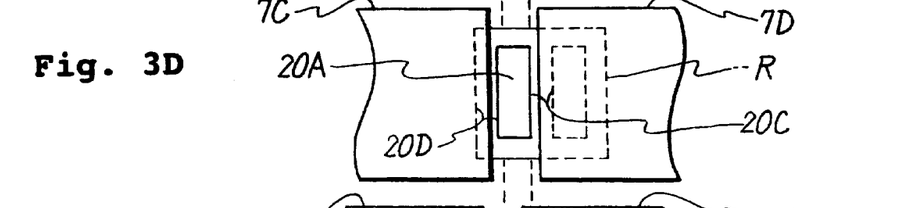
Figures 3E, 3F:
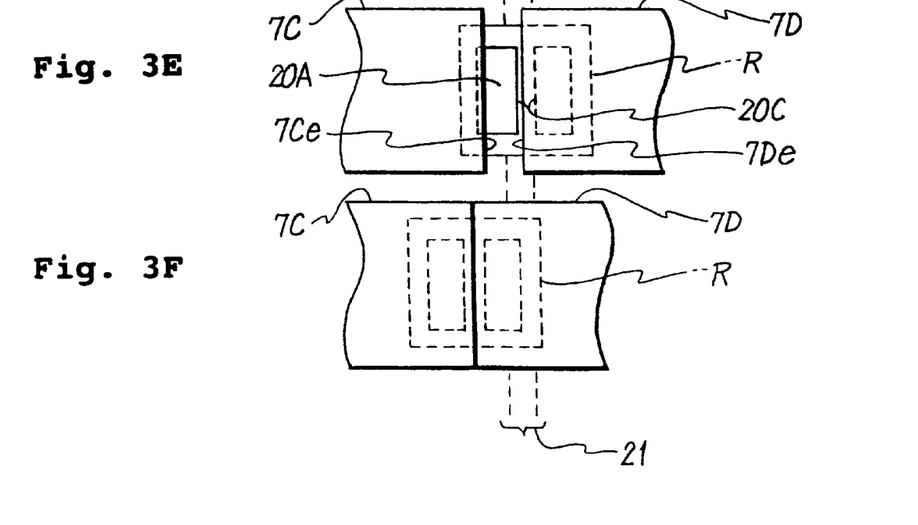

An example of the operation of the shielding plates 7C, 7D upon scanning exposure by using the projection exposure apparatus will be explained with reference to FIGS. 1 and 3. Details of this operation are disclosed by the present applicant in U.S. Pat. Nos. 5,473,410 and 5,477,304. These United States Patent documents are incorporated herein by reference. FIGS. 3A to 3F illustrate relationships among the illumination area, the shielding plates 7C, 7D of the movable blind 7, and the pattern area on the reticle R when only a specified pattern on the reticle R including a plurality of patterns is illuminated by using the movable blind 7. In FIGS. 3A to 3F, the shielding plates 7A, 7B for restricting the width of the illumination area perpendicular to the scanning direction as shown in FIG. 2 are omitted to simplify the explanation. As shown in FIG. 3A, two circuit pattern areas 20A, 20B are formed on the reticle R. A shielding section (shielding band) 20C having a width in the scanning direction of L1 is formed at a boundary between the circuit pattern areas 20A, 20B. Shielding sections 20D, 20E having the same width of L1 are also formed outside the circuit pattern areas 20A, 20B in the scanning direction respectively. The slit-shaped illumination area 21 formed on the reticle R is a slender rectangle having a width in the scanning direction of L2 as shown in FIG. 3A. The width L1 of the shielding sections 20C, 20D, 20E is set to be narrower than the width L2 of the illumination area 21.

When scanning exposure is performed by using the reticle R as described above, at first an operator inputs information on the circuit pattern areas 20A, 20B on the reticle R into the memory unit 17 through the input unit 16 shown in FIG. 1. When a pattern image in the first circuit pattern area 20A is transferred onto the wafer W through the projection optical system 13, the main control unit 12 reads information on the first circuit pattern area 20A contained in the circuit pattern information stored in the memory unit 17. The main control unit 12 controls the positions in the scanning direction of the shielding plates 7C, 7D of the movable blind 7 through the movable blind control unit 11 on the basis of the read information. Accordingly, as shown in FIGS. 3B to 3F, when the reticle R is scanned in the −Y direction with respect to the illumination area 21, the second circuit pattern area 20B on the reticle R is always covered with the other shielding plate 7D so that only the first circuit pattern area 20A is irradiated with the illumination light in the slit-shaped illumination area 21. In fact, images of the shielding plates 7C, 7D of the movable blind 7 are projected on the reticle R in FIGS. 3A to 3F. However, these images are regarded as the shielding plates 7C, 7D.

In the operation illustrated in FIGS. 3A to 3F, the main control unit 12 drives the wafer stage 14 through the wafer stage driving unit 15 to scan the wafer W in the scanning direction (Y direction) in synchronization with the operations of the reticle R and the movable blind 7. Assuming that the projection optical system 13 has a projection magnification of $M_{RW}$ for projection from the reticle R to the wafer W, the wafer W is scanned during exposure in the Y direction (or −Y direction) at a velocity of $V_{WO}(=M_{RW} \cdot V_{RO})$ in synchronization with scanning for the reticle R in the −Y direction (or Y direction) at a velocity of $V_{RO}$. In this embodiment, only the first circuit pattern area 20A on the reticle R is illuminated with the pulse-shaped illumination light. Accordingly, only the pattern image of the first circuit pattern area 20A is transferred onto the wafer W. On the contrary to the aforementioned case, when the reticle R is scanned in the Y direction with respect to the illumination area 21, the shielding plates 7C, 7D of the movable blind 7 are controlled in an order from FIG. 3F to FIG. 3B.

When a pattern on the second circuit pattern area 20B on the reticle R in FIG. 3A is transferred onto the wafer W, the main control unit 12 reads information on the second circuit pattern area 20B contained in the input information stored in the memory unit 17. The main control unit 12 controls the positions in the scanning direction of the shielding plates 7C, 7D through the movable blind control unit 11 on the basis of the read information. Namely, in the same manner as depicted in FIGS. 3A to 3F, the shielding plate 7C is allowed to follow the shielding section 20C upon the start of exposure, and the shielding plate 7D is allowed to follow the shielding section 20E upon the end of exposure, so that the first circuit pattern area 20A on the reticle R is covered with the shielding plate 7C. Thus only the second circuit pattern area 20B is irradiated with the illumination light in the slit-shaped illumination area 21. Accordingly, only the pattern image on the circuit pattern area 20B is transferred onto the wafer W.

The shielding plates 7A, 7B for defining the opening width in the direction (non-scanning direction) perpendicular to the scanning direction are not illustrated in FIGS. 3A to 3F. However, the opening formed by the shielding plates 7A, 7B may be fixed to have a predetermined shape during scanning exposure. When exposure is performed by superimposing a plurality of patterns in the direction perpendicular to the scanning direction to stitch the patterns, the shielding plates 7A, 7B may be rotated and moved upon image stitching as well.

Now the illuminance of the illumination area defined by the fixed field diaphragm 5 and the movable blind 7 will be considered. The fixed field diaphragm 5 is deviated from the conjugate position with respect to the reticle R. Accordingly, the intensity of light in a slit-shaped illumination area defined only by the fixed diaphragm is lowered at its ends as compared with its center in any of the non-scanning and scanning directions. As for the illuminance distribution in the non-scanning direction, the illuminance curve has downwardly inclined sections at both ends, and the illuminance distribution of the illumination area in the non-scanning direction is trapezoidal. However, the length of the illumination area in the non-scanning direction is defined by the shielding plates 7A, 7B located at the positions substantially conjugate to the reticle R. Accordingly, the illuminance distribution in the non-scanning direction in the slit-shaped illumination area is kept constant within an exposure field of the projection lens.

As described above, this embodiment is designed to make it possible to adjust at least one of the amount of deviation of the shielding plates 7A, 7B from the plane conjugate to the pattern plane on the reticle R and the amount of rotation of the shielding plates 7A, 7B in the plane perpendicular to the optical axis of the illumination optical system. Thus it is possible to change the illuminance distribution of the illumination area in the non-scanning direction on the reticle R (or the wafer W), especially the ratio of change in illuminance (inclination of the illuminance curve) at the ends, and the width in the non-scanning direction of the inclined portion at which the curve of illuminance distribution descends. On the contrary, the illuminance distribution of the illumination area in the scanning direction is definitely determined by the fixed field diaphragm 5. Namely, the illuminance distribution (including the inclination and its width) at the end is set depending on the spacing distance in the direction of the optical axis between the fixed field diaphragm 5 and the plane conjugate to the pattern plane on the reticle R. Accordingly, the illuminance distribution of the illumination area in the scanning direction is provided as a trapezoidal shape or a Gaussian distribution, providing an advantage that a substantially uniform amount of exposure light can be given to the entire surface of shot areas on the wafer especially when scanning exposure is performed by using a pulse light beam, as disclosed, for example, in Japanese Patent Laid-open No. 7-66103 (U.S. patent application Ser. No. 08/294,981 filed on Aug. 24, 1994). Upon the start and the end of scanning exposure, or during periods just before or after the start and the end of scanning exposure, the shielding plates 7C, 7D restrict the width of the illumination area in the scanning direction on the reticle R defined by the opening 70 of the fixed field diaphragm 5. This setting is provided in order that those other than the shot areas on the wafer W (areas on which corresponding pattern images are to be formed) are prevented from unnecessary exposure with light, which would be otherwise caused by illumination light passing through portions other than the pattern on the reticle R to be transferred onto the wafer W by performing one time of scanning exposure.

In this embodiment, the shape of the substantially slit-shaped illumination area on the reticle R is defined by the fixed field diaphragm 5 in the scanning direction and by the shielding plates 7A, 7B of the movable blind 7 in the non-scanning direction respectively. Thus the amount of exposure light is also controlled when image stitching is performed as described below.

Figure 4A:
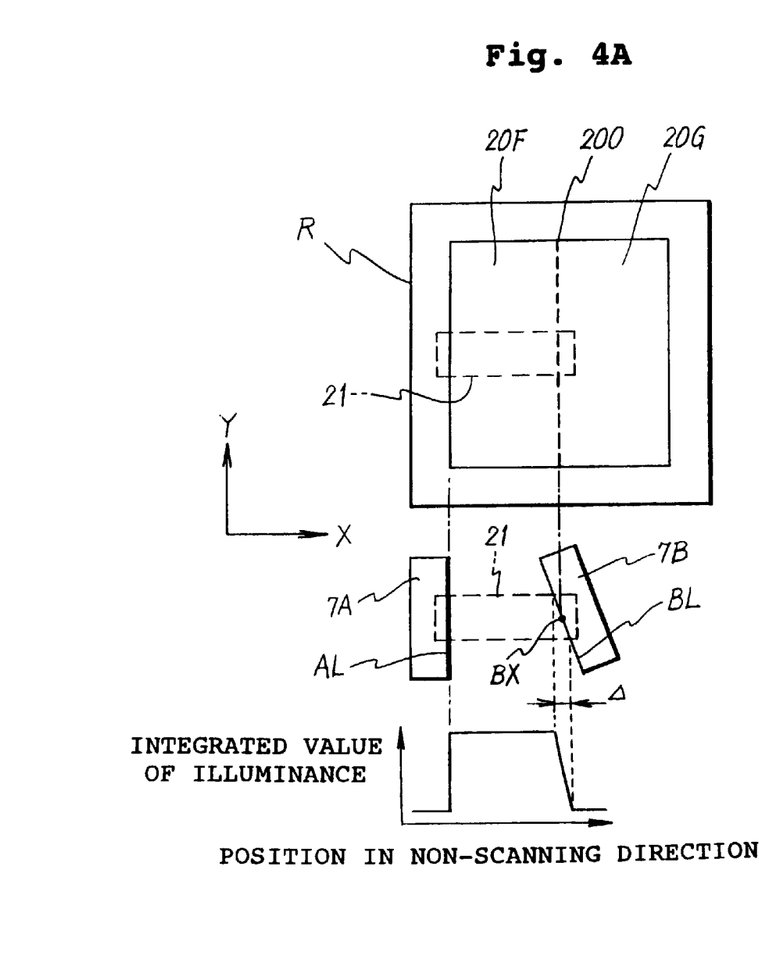
FIG. 4A is illustrative of when a pattern on a reticle R is divided into two and an area 20F is scanned in an embodiment, conceptually showing a rotational operation of the shielding plate for restricting a width of an illumination area in the direction perpendicular to the scanning direction, and an illuminance distribution after scanning for the divided one pattern area.
Figure 4B:
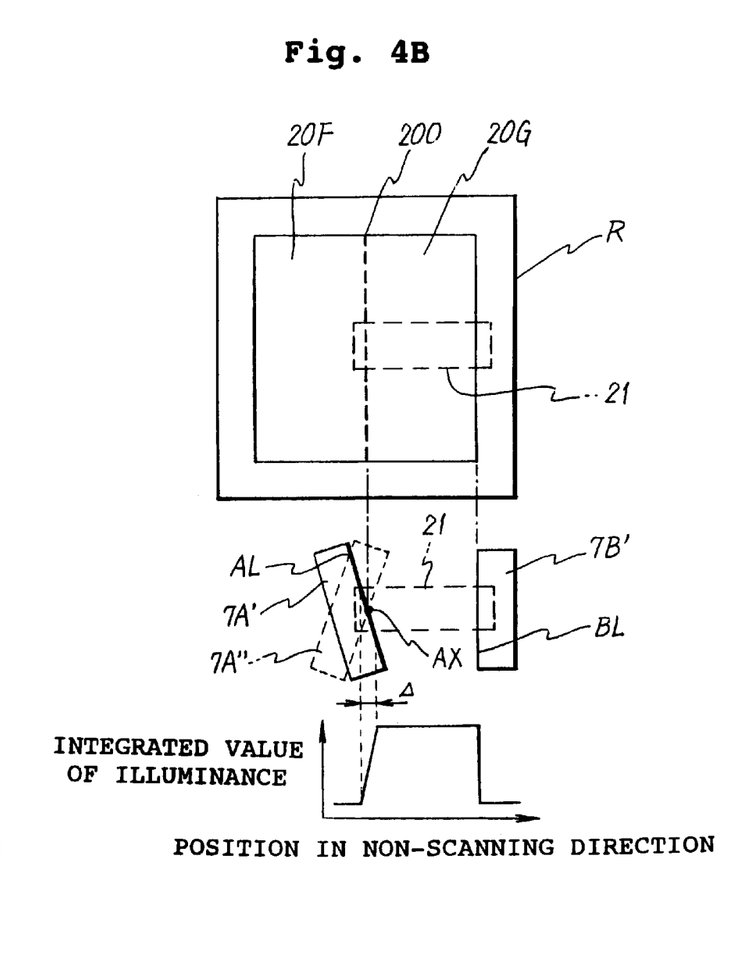
FIG. 4B is illustrative of when the pattern on the reticle R is divided into two and an area 20G is scanned in the embodiment, conceptually showing a rotational operation of the shielding plate for restricting a width of the illumination area in the direction perpendicular to the scanning direction, and an illuminance distribution after scanning for the divided one pattern area.

FIGS. 4A and 4B shows an exemplary operation of the shielding plates 7A, 7B of the movable blind 7 in the non-scanning direction when a continuous reticle pattern is divided into a plurality of areas to perform scanning exposure while superimposing a part of the areas. This embodiment is different in the reticle pattern from the embodiment illustrated in FIGS. 3A to 3F. In FIGS. 4A and 4B, the reticle R has a continuous pattern area sufficiently wider than the slit-shaped illumination area 21 in both of the scanning and non-scanning directions. In this embodiment, the pattern area on the reticle R has to be divided into two, namely into areas 20F, 20G in the non-scanning direction so that the areas 20F, 20G are illuminated and stitched at a stitching section 200. Accordingly, an area having a predetermined width Δ in the vicinity of the stitching section 200 is illuminated in a superimposed manner, and an area on the photosensitive substrate corresponding thereto is also scanned and exposed in a superimposed manner.

At first, as shown in FIG. 4A, the reticle R is moved in the non-scanning direction by using the reticle stage 9, and it is set at a scanning start position so that the illumination area 21 is formed on the area 20F on the reticle R. In this embodiment, the spacing distance between the shielding plates 7A, 7B for defining the width of the movable blind 7 in the non-scanning direction is determined depending on a length of the pattern on the reticle in the direction perpendicular to the scanning direction. The spacing distance is adjusted by the driving units 6A, 6B. As for the shielding plates 7A, 7B, the shielding plate 7A for shielding a side (left side in FIG. 4A) opposite to the image stitching section 200 is arranged so that its edge AL in the longitudinal direction is parallel to the scanning direction. On the other hand, the shielding plate 7B located on a side of the stitching section 200 is rotated counterclockwise by an angle α in a plane perpendicular to the optical axis about an axis of a middle point BX of an edge BL after the edge BL on a side of the opening of the movable blind 7 is arranged on the stitching section 200 by the driving unit 6B. Thus the edge of the shielding plate 7B in the longitudinal direction is inclined by the angle α with respect to the scanning direction. After setting of the shielding plates 7A, 7B as described above, the reticle stage 9 is moved in the −Y direction with respect to the illumination area 21 as illustrated in FIG. 3 while maintaining the aforementioned rotational angle, and the photosensitive substrate W is moved in the Y direction by using the XY stage 14. Thus relative scanning for the area 20F is executed.

After the scanning exposure for the area 20F is completed, the illuminance is integrated in the scanning direction to determine an illuminance distribution in the area 20F which is shown at a lower part in FIG. 4A by using the non-scanning direction as an axis of abscissa. In the area corresponding to the spacing distance Δ in which the edge BL traverses the illumination area 21 in accordance with the rotation (angle α) of the shielding plate 7B, the illumination light is partially intercepted by the shielding plate 7B. Therefore, the integrated value of illuminance gradually lowers as the position in the X direction moves toward the area 20G, forming a descending slope in the illuminance distribution. The area corresponding to the spacing distance Δ is illuminated in a superimposed manner when the pattern area 20G on the reticle is scanned and exposed.

After completion of the scanning in the Y direction for the pattern area 20F and the scanning exposure for the area on the photosensitive substrate corresponding thereto, the reticle stage 9 is moved in the non-scanning direction (−X direction) to position the pattern area 20G with respect to the illumination area 21. Simultaneously, the wafer W is also moved in the non-scanning direction (+X direction) by the stage 14. After that, the shielding plate 7B for shielding the right end of the reticle pattern is rotated by an angle of −α about an axis of the middle point BX of the edge BL so that the edge BL in the longitudinal direction is parallel to the scanning direction. On the other hand, the shielding plate 7A, which is located on the side of the stitching section 200 in the reticle pattern, has its edge AL located over the stitching section 200 as a result of the movement of the reticle stage 9 in the non-scanning direction. The shielding plate 7A is rotated and moved in the plane perpendicular to the optical axis about a center of a middle point AX of the edge AL so that the edge AL is inclined with respect to the scanning direction. The rotational angle for this rotational movement has to be the same as the rotational angle +α of the edge BL of the shielding plate 7B rotated during the scanning for the area 20F. After adjustment for the rotational positions of the shielding plates 7A, 7B, the area 20G on the reticle R and the photosensitive substrate are relatively scanned in the same manner as performed for the area 20F. However, the scanning directions for the reticle and the photosensitive substrate are opposite to the directions used for the area 20F. FIG. 4B shows, at its lower part, an illuminance distribution determined by integration over the area 20G after completion of the scanning for the area 20G. As illustrated in this illuminance distribution, the obtained illuminance distribution is symmetrical to that obtained after the scanning for the area 20F. The scanning exposure for the area 20F provides the same superficial content of the area corresponding to the spacing distance α as that provided by the scanning exposure for the area 20G. As described above, the rotational angle of the shielding plate 7B during the scanning for the area 20F is adjusted to be the same as the rotational angle of the shielding plate 7A during the scanning for the area 20G. Accordingly, the integrated value of the illumination light amount in the scanning direction in the area corresponding to the spacing distance Δ illuminated in the superimposed manner during the scanning for the areas 20F, 20G, which is obtained by cumulating those for both of the scanning exposure for the area 20F and the scanning exposure for the area 20G, is equal to the integrated value of the illuminance obtained after one time of the scanning exposure for the reticle pattern areas other than the area corresponding to the spacing distance Δ. Therefore, even when the image stitching exposure is performed, the same amount of exposure light is obtained at both of the exposure-stitching section on the wafer and the other areas on the wafer. Thus uneven exposure does not take place, and the entire wafer enjoys uniform exposure.

As for the rotation of the shielding plates 7A, 7B, the rotational direction may be either clockwise (7A") or counterclockwise (7A') as shown in FIG. 4B. Assuming that an allowance for non-uniformity of the amount of exposure light caused by a positioning error e in the non-scanning direction is A, the rotational angle of the shielding plate may be set so that $\Delta \geq \epsilon/A$ is satisfied.

Figure 5:
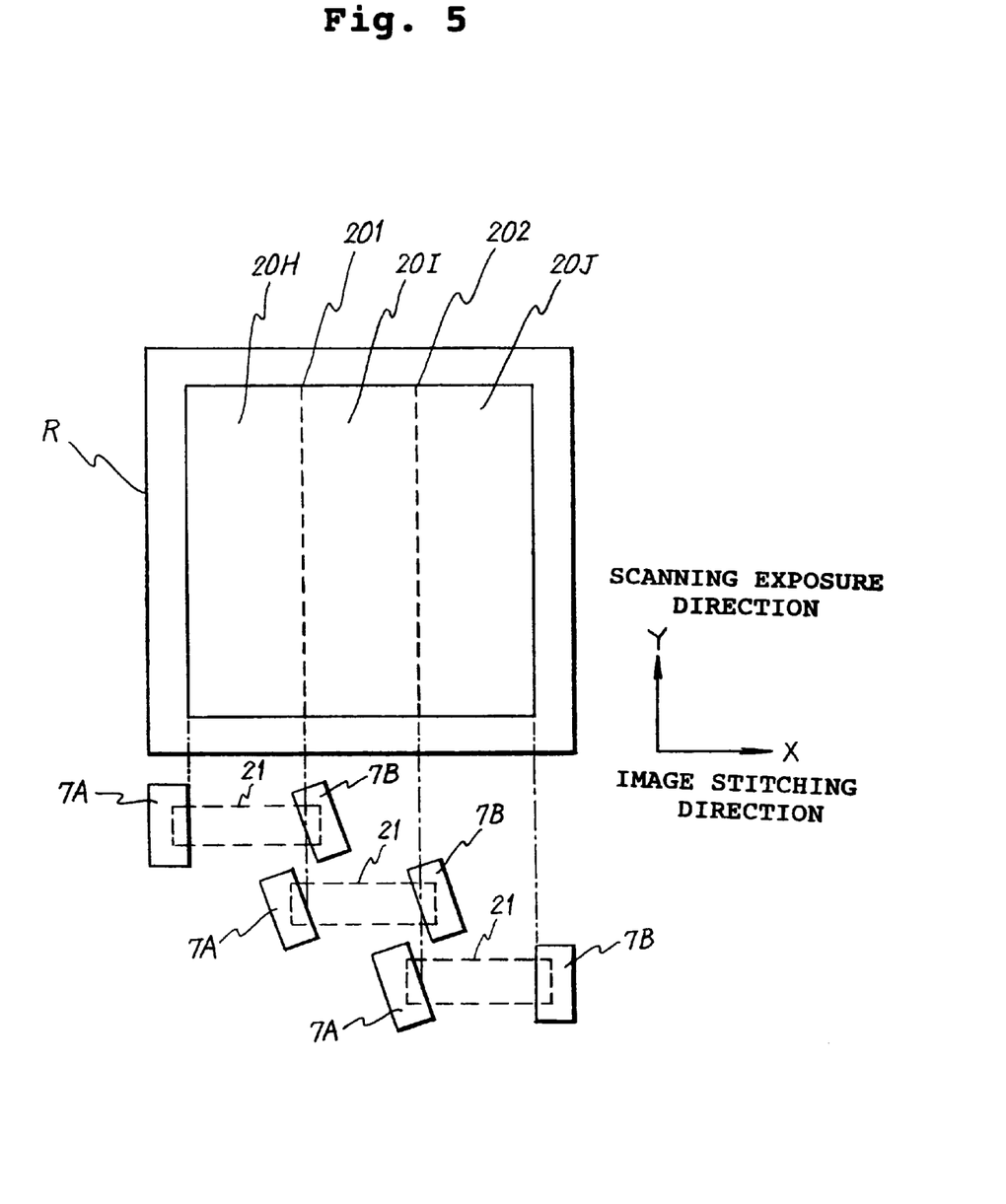
FIG. 5 is illustrative of when a pattern on a reticle R is divided into three to perform scanning exposure, showing a rotational operation of the shielding plate for restricting a width of an illumination area in the direction perpendicular to the scanning direction, and a positional relationship with respect to stitching sections.

Next, FIG. 5 illustrates an embodiment in which a reticle R, which has a pattern area larger than that on the reticle shown in FIG. 4, is scanned and exposed in accordance with two times of image stitching. Two image stitching sections 201, 202 are assumed in the pattern on the reticle R. Three pattern areas 20H, 20I, 20J divided by the stitching sections 201, 202 are scanned and exposed by three times of operations while superimposing portions in the vicinity of the stitching sections. At first, in order to scan the area 20H in the Y direction, the reticle R is firstly moved by the reticle stage 9 in the non-scanning direction to set it at the scanning start position so that the illumination area 21 is formed on the area 20H on the reticle R in the same manner as depicted in FIG. 4 (A). As for the shielding plates 7A, 7B for defining the width of the movable blind 7 in the non-scanning direction, the shielding plate 7A for shielding the side opposite to the image stitching section 201 is located before the scanning exposure so that its edge AL in the longitudinal direction is parallel to the scanning direction. The shielding plate 7B located on the side of the stitching section 201 is rotated counterclockwise by an angle a in the plane perpendicular to the optical axis about the rotational axis of the middle point BX of the edge BL after the edge BL on the side of the opening of the movable blind 7 is arranged over the stitching section 201 by the driving unit 6B. After the shielding plates 7A, 7B are set as described above, the reticle stage 9 is moved in the −Y direction with respect to the illumination area 21, and the photosensitive substrate W is moved in the Y direction by using the XY stage 14. Thus relative scanning for the area 20H is executed.

After completion of the scanning in the Y direction for the pattern area 20H and the scanning exposure for the area on the photosensitive substrate corresponding thereto, the reticle stage 9 is moved in the non-scanning direction (−X direction) to position the pattern area 20I with respect to the illumination area 21. At this time, the middle point AX of the edge AL of the shielding plate 7A and the middle point BX of the edge BL of the shielding plate 7B are located over the stitching sections 201, 202 respectively. Simultaneously, the wafer W is also moved in the non-scanning direction (+X direction) by the stage 14. Next, the shielding plate 7B is allowed to maintain the angle α as it is, while the shielding plate 7A is rotated and moved in the plane perpendicular to the optical axis about the rotational axis of the middle point AX of the edge AL so that the edge AL is inclined by the angle α with respect to the scanning direction. After that, relative scanning is performed for the area 20I on the reticle R and the photosensitive substrate in the same manner as performed for the area 20H.

After completion of the scanning for the area 20I, the reticle R is moved in the −X direction by the reticle stage 9, and the wafer W is moved in the X direction by the XY stage in order to scan the area 20J. As a result, the middle point AX of the edge AL of the shielding plate 7A is located over the stitching section 202, and the middle point BX of the edge BL of the shielding plate 7B is located over the right side end of the reticle pattern. The shielding plate 7B has its edge BL returned to be parallel to the scanning direction, while the shielding plate 7A has its edge AL allowed to maintain the angle α with respect to the scanning direction. In this state, the area 20J is scanned. When the image stitching is performed by using the stitching sections 201, 202 as described above, the spacing distance Δ, at which the illumination light is superimposed, is also identical for the stitching sections 201, 202 because the rotational angle α of the shielding plate is identical at each of the stitching sections. Accordingly, the sum of illuminance in the area corresponding to the spacing distance Δ is the same as those of the other areas at which the illumination light is not superimposed. The corresponding exposure-stitching sections on the photosensitive substrate receive the same amount of exposure light as those of the other exposure areas, resulting in uniform exposure over the entire photosensitive substrate.

The operations of the rotational movement of the shielding plates 7A, 7B are controlled by the movable blind control unit 11 together with the movement operations of the shielding plates 7A, 7B, which are managed through the main control system so that they are synchronized with the operations of the reticle stage 9 and the wafer stage 14.

In the embodiments described above, the reticle stage is moved in the direction perpendicular to the scanning direction to perform the scanning exposure by means of the image stitching for the continuous pattern on the identical reticle. However, the present invention may be used for image stitching for patterns on different reticles. However, in such an embodiment, it is necessary to form an identical pattern on areas corresponding to the width Δ of the inclined section of the illuminance distribution, the areas serving as stitching sections for the different reticles used for the image stitching.

In the embodiments described above, the illuminance on the side of the image stitching section is lowered by rotating one of the shielding plates for restricting the width of the illumination area on the reticle in the direction perpendicular to the scanning direction. However, the illuminance on the side of the image stitching section may be lowered by moving one of the shielding plates substantially along the optical axis toward the projection optical system so that the image of the moved shielding plate is defocused.

In the embodiments described above, the illuminance on the side of the image stitching section is lowered so that the illuminance distribution depicted by using the non-scanning direction as the axis of abscissa is trapezoidal by rotating one of the shielding plates for restricting the width of the illumination area on the reticle in the direction perpendicular to the scanning direction. However, the present invention is not limited thereto. It is also possible to lower the illuminance in a form of a curved line such as a sine curve by appropriately changing the shape of the shielding plate.

In the embodiments described above, the pulse light source 1 is used as a light source for exposure. However, the present invention may be applied as it is even when a continuous light source such as a mercury lamp is used as a light source for exposure. It is needless to say that the projection optical system 13 in the embodiments described above may be any one of a refraction system, a reflection system, and a catadioptric system. The present invention is not limited to only the projection exposure apparatus, and it may be applied to exposure apparatuses of the contact system and the proximity system. In the embodiments described above, the slit-shaped illumination area is rectangular. However, it is needless to say that the present invention may be also applied to a circular arc-shaped illumination area. Thus the present invention is not limited to the embodiments described above, and it may take various forms within a range not departing from the spirit of the present invention.

According to the scanning exposure apparatus of the present invention, the illuminance distribution, which is represented by the integrated value of the illuminance in the scanning direction on the photosensitive substrate for one time of scanning exposure, can be independently changed at the both ends in the non-scanning direction by independently controlling the rotation or the movement of the two shielding plates in the non-scanning direction for constituting the movable field diaphragm. Accordingly, the present invention is useful for the scan-and-stitch exposure in which the photosensitive substrate is scanned and exposed by dividing a continuous reticle pattern into a plurality of areas and performing a plurality times of scanning in accordance with the image stitching technique, wherein a uniform amount of exposure light can be obtained for both of the exposure-stitching section and the other exposed areas by exposing the exposure-stitching section in the superimposed manner by performing two times of scanning exposure for the exposure-stitching section. Thus the entire photosensitive substrate can be subjected to uniform exposure.

What is claimed is:

1. A scanning type exposure apparatus comprising:
    an illumination optical system which illuminates a mask;
    a scanning system which synchronously scans the mask and a photosensitive substrate with respect to an illumination area on the mask;
    a first field diaphragm which sets a width of the illumination area in a scanning direction; and
    a second field diaphragm which varies a shape of at least one end of the illumination area in the direction perpendicular to the scanning direction, the second field diaphragm includes a component that defines the illumination area in the direction perpendicular to the scanning direction, and the shape of the at least one end of the illumination area is varied by movement of the component.

2. The scanning type exposure apparatus according to claim 1, wherein the apparatus is a scan-and-stitch type apparatus for stitching and forming a plurality of pattern images while partially superimposing them on the photosensitive substrate along the direction perpendicular to the scanning direction.

3. The scanning type exposure apparatus according to claim 1, wherein the second field diaphragm comprises a shielding plate which is movable in a plane perpendicular to an optical axis of the illumination optical system for restricting the shape of the at least one end of the illumination area in the direction perpendicular to the scanning direction to provide intersection with the scanning direction.

4. The scanning type exposure apparatus according to claim 1, wherein the second field diaphragm comprises first and second shielding plates which are arranged in a plane perpendicular to an optical axis of the illumination optical system and at least one of which is rotatable in the plane for restricting the shapes of the both ends of the illumination area in the direction perpendicular to the scanning direction respectively.

5. The scanning type exposure apparatus according to claim 1, wherein:
    the second field diaphragm is arranged in a plane which is substantially optically conjugate with respect to a pattern plane on the mask; and
    the first field diaphragm is arranged apart from the conjugate plane in an axial direction of the illumination optical system.

6. The scanning type exposure apparatus according to claim 1, wherein:
    the first field diaphragm is a fixed field diaphragm; and
    the apparatus further comprises a third field diaphragm for varying the width of the illumination area in the scanning direction, in addition to the fixed field diaphragm.

7. The scanning type exposure apparatus according to claim 6, wherein the third field diaphragm comprises at least two shielding plates for restricting shapes of both ends of the illumination area in the scanning direction, and the at least two shielding plates are movable in the scanning direction in synchronization with scanning for the mask and the photosensitive substrate, the at least two shielding plates being capable of changing the width of the illumination area in the scanning direction.

8. The scanning type exposure apparatus according to claim 4, wherein:
    the apparatus is a scan-and-stitch type apparatus for stitching and forming a plurality of pattern images while partially superimposing them on the photosensitive substrate along the direction perpendicular to the scanning direction; and
    an amount of light radiated onto a pattern area corresponding to a superimposed portion is lowered by rotating at least one of the first and second shielding plates when the plurality of pattern images are superimposed.

9. The scanning type exposure apparatus according to claim 8, wherein a rotational angle of at least one of the first and second shielding plates is adjusted so that an amount of exposure light given to the superimposed portion of the plurality of pattern images on the photosensitive substrate is substantially the same as an amount of exposure light given to the other portions.

10. A scanning type exposure apparatus comprising:
    an illumination optical system for illuminating a mask;
    a scanning system for synchronously scanning the mask and a photosensitive substrate with respect to an illumination area on the mask;
    a first field diaphragm for setting a width of the illumination area in a scanning direction; and
    a second diaphragm comprising first and second shielding plates for restricting the shapes of both ends of the illumination area in a direction perpendicular to the scanning direction respectively, wherein at least one of the first and second shielding plates is movable along an optical axis of the illumination optical system with respect to a pattern plane on the mask or a plane conjugate to the pattern plane.

11. The scanning type exposure apparatus according to claim 10, wherein the apparatus is of a scan-and-stitch type apparatus for stitching and forming a plurality of pattern images while partially superimposing them on the photosensitive substrate along the direction perpendicular to the scanning direction.

12. The scanning type exposure apparatus according to claim 10, wherein the second field diaphragm is arranged in a plane which is substantially optically conjugate with respect to a pattern plane on the mask; and
    the first field diaphragm is arranged apart from the conjugate plane in an axial direction of the illumination optical system.

13. The scanning type exposure apparatus according to claim 10, wherein:
    the first field diaphragm is a fixed field diaphragm; and
    the apparatus further comprises a third field diaphragm for varying the width of the illumination area in the scanning direction, in addition to the fixed field diaphragm.

14. The scanning type exposure apparatus according to claim 13, wherein the third field diaphragm comprises third and fourth shielding plates for restricting both ends of the illumination area in the scanning direction, and the third and fourth shielding plates are movable in the scanning direction in synchronization with scanning for the mask and the photosensitive substrate, the third and fourth shielding plates being capable of changing the width of the illumination area in the scanning direction.

15. The scanning type exposure apparatus according to claim 11, wherein an amount of light radiated onto a pattern area corresponding to a superimposed portion is lowered by moving at least one of the first and second shielding plates along the optical axis of the illumination optical system when the plurality of pattern images are superimposed.

16. The scanning type exposure apparatus according to claim 11, wherein at least one of the first and second shielding plates is moved along the optical axis of the illumination optical system so that an amount of exposure light given to the superimposed portion of the plurality of pattern images on the photosensitive substrate is substantially the same as an amount of exposure light given to the other portions.

17. A scanning type exposure apparatus which transfers a pattern formed on a mask onto a substrate by synchronously moving the mask and the substrate comprising:
   an illumination optical system which is disposed between a light source and the mask to illuminate the mask;
   a field diaphragm which is disposed within the illumination optical system to define at least one end of an illumination area on the mask in a direction perpendicular to the synchronously moving direction; and
   a driving device which is connected with the field diaphragm to adjust a distribution of cumulative light amount of illumination light by varying a shape of the at least one end of the illumination area on the mask in the direction perpendicular to the synchronously moving direction;
   wherein the field diaphragm includes a component that defines the illumination area in the direction perpendicular to the synchronously moving direction, and the shape of the at least one end of the illumination area is varied by movement of the component.

18. The scanning type exposure apparatus according to claim 17, wherein the field diaphragm has at least one edge which defines a width of the illumination area in the direction perpendicular to the synchronously moving direction, and the driving device rotates the at least one edge in a plane perpendicular to an optical axis of the illumination optical system.

19. The scanning type exposure apparatus according to claim 18, wherein the driving device moves the at least one edge along the optical axis of the illumination optical system.

20. The scanning type exposure apparatus according to claim 19, further comprising a first diaphragm which is disposed in the illumination optical system and defines a width of the illumination area in the synchronously moving direction.

21. The scanning type exposure apparatus according to claim 17, wherein the distribution of cumulative light amount of the illumination light in the direction perpendicular to the synchronously moving direction slopes at the at least one end of the distribution.

22. The scanning type exposure apparatus according to claim 21, wherein a distribution of light intensity of the illumination light in the synchronously moving direction is sloped at both ends of the distribution of light intensity of the illumination light.

23. The scanning type exposure apparatus according to claim 22, further comprising a second diaphragm that is arranged apart from a conjugate plane in the illumination optical system with respect to the pattern formed on the mask, and that defines a width of the illumination area in the synchronously moving direction.

24. A scanning type exposure apparatus which exposes a substrate with an illumination light that passes through a mask while moving the mask and the substrate relative to the illumination light, comprising:
   an exposure system that has an optical axis orthogonal to a scanning direction and a non-scanning direction and that exposes the substrate with the illumination light so that an illumination distribution of the illumination light in the non-scanning direction is sloped along at least one end of the illumination distribution; and
   an optical device which is positioned in the exposure system and adjusts the slope of the illumination distribution of the at least one end of the illumination distribution in the non-scanning direction.

25. The scanning type exposure apparatus according to claim 24, wherein the optical device also adjusts a width of an area in which the slope exists in the illumination distribution.

26. The scanning type exposure apparatus according to claim 25, wherein the optical device has a pair of first edges which define a width of an illumination area on the substrate in the non-scanning direction, and the illumination distribution is adjusted by a movement of at least one of the pair of first edges.

27. The scanning type exposure apparatus according to claim 26, wherein the optical device has a pair of second edges which define a width of the illumination area on the substrate in the scanning direction so that an illumination distribution in the scanning direction is sloped at both ends of the illumination distribution in the scanning direction.

28. The scanning type exposure apparatus according to claim 27, wherein the optical device has a pair of third edges which vary, during the scanning type exposure, the width of the illumination area on the substrate in the scanning direction.

29. The scanning type exposure apparatus according to claim 27, wherein the exposure system includes an illumination optical system which illuminates the mask, and the optical device is disposed in the illumination optical system.

30. The scanning type exposure apparatus according to claim 29, wherein the optical device has a first diaphragm and a second diaphragm disposed apart from the first diaphragm, the first diaphragm has the pair of first edges, and the second diaphragm has the pair of second edges.

31. The scanning type exposure apparatus according to claim 24, wherein the optical device adjusts the illumination distribution in the non-scanning direction so that the illumination distribution during a scanning exposure of a first area on the substrate is different from the illumination distribution during a scanning exposure of a second area which is partially superimposed with the first area.

32. The scanning type exposure apparatus according to claim 31, wherein the exposure system illuminates the mask so that an illumination distribution in the scanning direction shows slopes at both ends of the illumination distribution in the scanning direction.

33. The scanning type exposure apparatus according to claim 32, wherein the exposure system defines an illumination area on the substrate so as to have a rectangular shape extending in the non-scanning direction.

34. The scanning type exposure apparatus according to claim 33, wherein the exposure system changes the shape of the illumination area to adjust the illumination distribution.

35. A scanning exposure method for exposing a substrate with an illumination light that passes through a mask while moving the mask and the substrate relative to the illumination light in a scanning direction, comprising the steps of:

exposing a first area on the substrate with the illumination light having an illumination distribution of the illumination light on the substrate, at least one end of the illumination distribution in a non-scanning direction being sloped;

changing the slope of the illumination distribution of the illumination light at the at least one end of the illumination distribution in the non-scanning direction; and exposing a second area on the substrate, which is partially superimposed with the first area in the non-scanning direction, with the illumination light having the changed illumination distribution of the illumination light.

36. The scanning exposure method according to claim 35, wherein an illumination distribution in the scanning direction is sloped at both ends of the illumination distribution.

37. The scanning exposure method according to claim 35, wherein the illumination distribution of the illumination light in the non-scanning direction is adjusted by moving a plate of a field diaphragm which defines an illumination area of the illumination light on the substrate.

38. A method for manufacturing a micro-device comprising transferring patterns of a device onto a plurality of areas which are partially superimposed on a work-piece by utilizing the scanning exposure method of claim 35.

* * * * *